United States Patent
Liu et al.

(10) Patent No.: US 11,749,664 B2
(45) Date of Patent: *Sep. 5, 2023

(54) MEMORY CIRCUITS

(71) Applicant: TAIWAN SEMICONDUCTOR MANUFACTURING COMPANY LTD., Hsinchu (TW)

(72) Inventors: Yi-Ching Liu, Hsinchu (TW); Yih Wang, Hsinchu (TW); Chia-En Huang, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/811,903

(22) Filed: Jul. 12, 2022

(65) Prior Publication Data
US 2022/0359484 A1  Nov. 10, 2022

Related U.S. Application Data

(63) Continuation of application No. 17/225,913, filed on Apr. 8, 2021, now Pat. No. 11,424,233.

(51) Int. Cl.
*H01L 25/18* (2023.01)
*H01L 23/31* (2006.01)
(Continued)

(52) U.S. Cl.
CPC ............ *H01L 25/18* (2013.01); *G11C 7/1069* (2013.01); *G11C 7/1096* (2013.01); *G11C 8/08* (2013.01);
(Continued)

(58) Field of Classification Search
CPC ..... H01L 25/18; H01L 23/3157; H01L 24/24; H01L 2224/24137; H01L 2224/24146; H01L 2924/1431; H01L 2924/1434; H01L 24/16; H01L 24/32; H01L 24/73; H01L 24/92; H01L 24/13; H01L 25/0655; H01L 2224/13013; H01L 2224/16227;
(Continued)

(56) References Cited

U.S. PATENT DOCUMENTS

| 11,424,233 | B1 * | 8/2022 | Liu | H01L 24/13 |
| 11,475,937 | B2 * | 10/2022 | Song | H01L 23/60 |

(Continued)

FOREIGN PATENT DOCUMENTS

WO    WO-2021231120 A1 * 11/2021 ............. G11C 29/18

*Primary Examiner* — Fernando Hidalgo
(74) *Attorney, Agent, or Firm* — WPAT LAW; Anthony King

(57) ABSTRACT

A circuit is provided. The circuit includes a first die that includes a memory array, and the memory array includes a plurality of memory cells, a sensing element coupled to the plurality of memory cells, and a first plurality of conductive pads coupled to the sensing element. The circuit also includes a second die that includes an address decoder associated with the memory array of the first die and a second plurality of conductive pads coupled to the address decoder. The first die is coupled to the second die by an interposer. The address decoder of the second die is coupled to the sensing element of the first die. A first voltage swing of the first die is larger than a second voltage swing of the second die.

20 Claims, 9 Drawing Sheets

(51) Int. Cl.
  *H01L 23/00* (2006.01)
  *G11C 7/10* (2006.01)
  *G11C 8/10* (2006.01)
  *G11C 8/08* (2006.01)
(52) U.S. Cl.
  CPC ............ *G11C 8/10* (2013.01); *H01L 23/3157* (2013.01); *H01L 24/24* (2013.01); *H01L 2224/24137* (2013.01); *H01L 2224/24146* (2013.01); *H01L 2924/1431* (2013.01); *H01L 2924/1434* (2013.01)
(58) Field of Classification Search
  CPC . H01L 2224/32225; H01L 2224/73204; H01L 2224/92125; H01L 2924/15192; G11C 8/10; G11C 7/1069; G11C 7/1096; G11C 8/08; G11C 7/1045; G11C 7/18; G11C 8/14; G11C 5/025

USPC ........................................................... 365/63
  See application file for complete search history.

(56) References Cited

U.S. PATENT DOCUMENTS

| | | | |
|---|---|---|---|
| 2018/0364749 A1* | 12/2018 | Tanadi | H01L 25/105 |
| 2019/0354653 A1* | 11/2019 | Weng | H01L 45/16 |
| 2020/0022273 A1* | 1/2020 | Han | H05K 3/4007 |
| 2021/0366874 A1* | 11/2021 | Choi | G11C 5/06 |
| 2021/0391288 A1* | 12/2021 | Yang | H01L 27/10897 |
| 2022/0035597 A1* | 2/2022 | Jung | H01L 22/32 |
| 2022/0068850 A1* | 3/2022 | Akou | G11C 7/1057 |
| 2022/0139433 A1* | 5/2022 | Kwon | G11C 8/08 365/233.1 |
| 2022/0216168 A1* | 7/2022 | Ishihara | G11C 5/14 |

\* cited by examiner

MEMORY CIRCUITS

CROSS-REFERENCE TO RELATED APPLICATION

This application claims the benefit of U.S. patent application Ser. No. 17/225,913 filed on Apr. 8, 2021, which application is hereby incorporated herein by reference.

BACKGROUND

A memory device, such as a semiconductor memory, is a data storage device, such as an electronic data storage device. The memory device is often used as computer memory and implemented as a circuit, such as a semiconductor-based integrated circuit.

Memory devices are made in many different types and technologies. Electrical memory has much faster access times than other types of data storage technologies. For example, a byte of data can often be written to or read from electrical memory within a few nanoseconds, while access times for magnetic storage, such as hard disks, is in the range of milliseconds. For these reasons, among others, an electric memory such as a semiconductor memory is often used as a primary storage mechanism for computer memory to hold data the computer is currently working on, among other uses.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
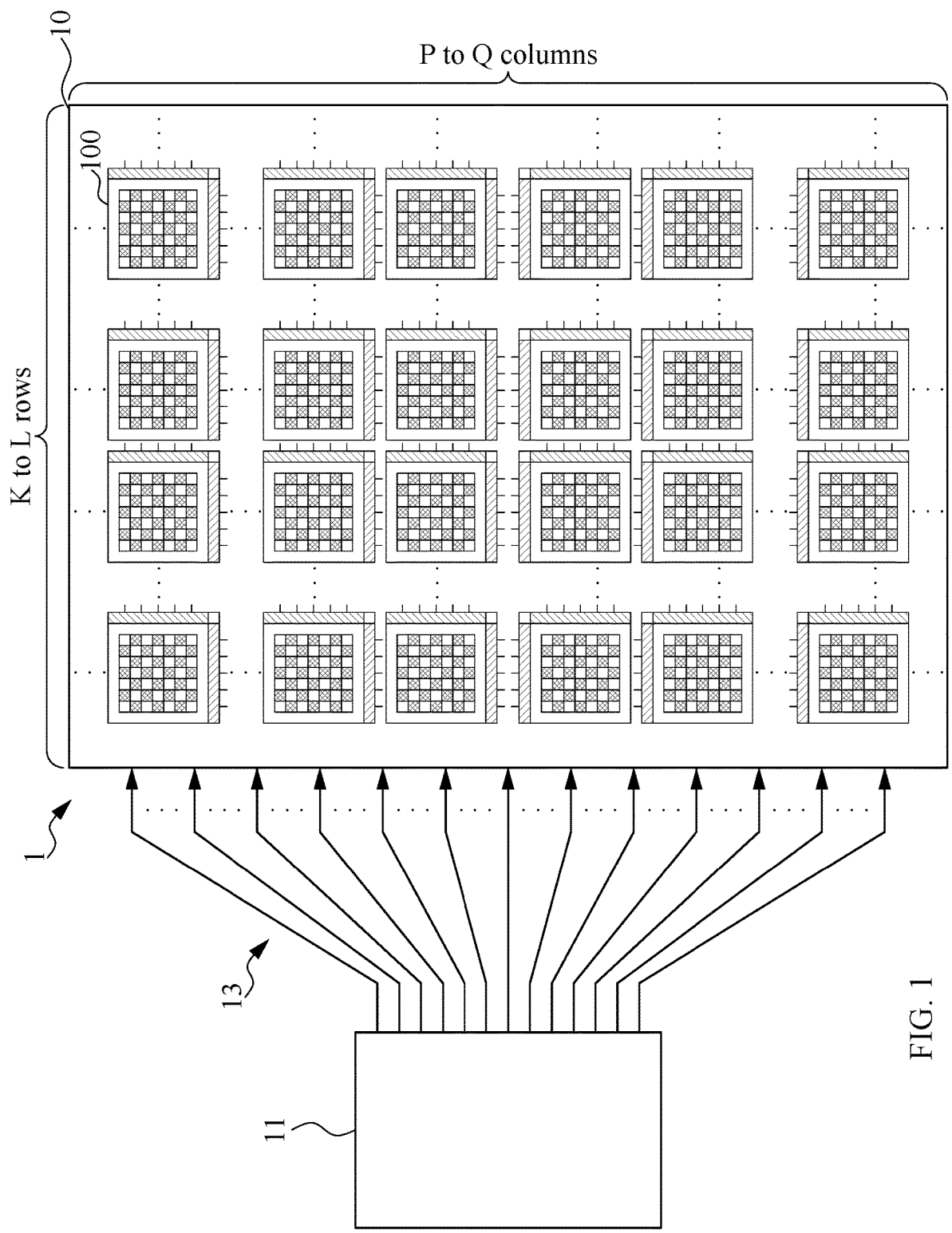
FIG. 1 illustrates a circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, two layers/patterns/structures being formed on a same level means that the two layers/patterns/structures have a same distance from a reference plane, for example, a surface of a substrate, based on which a semiconductor device is formed, or the two layers/patterns/structures are intended to be configured to have a same distance from a reference plane, for example, a surface of a substrate, based on which a semiconductor device is formed but may not perfectly have the same distance from the reference plane due to design, manufacturing, measurement errors/margins caused by unperfected manufacturing and measurement conditions. Such a description should be recognizable to one of ordinary skill in the art.

In the present disclosure, two layers/patterns/structures being formed on different level means that with consideration of variations/errors caused by, for example, surface roughness, the two layers/patterns/structures have different distances from a reference plane, for example, a surface of a substrate, based on which a semiconductor device is formed.

In the present disclosure, a phrase "one of A, B and C" means "A, B and/or C" (A B, C, A and B, A and C, B and C, or A, B and C), and does not mean one element from A, one element from B and one element from C, unless otherwise described.

In the present disclosure, "about" or "approximately" used to describe a value of a parameter means that the parameter is equal to the described value or that the parameter is within a certain range of the described value, when design error/margin, manufacturing error/margin, measurement error etc. are considered. Such a description should be recognizable to one of ordinary skill in the art.

Any of the embodiments described herein may be used alone or together with one another in any combination. The one or more implementations encompassed within this specification may also include embodiments that are only partially mentioned or alluded to or are not mentioned or alluded to at all in this brief summary or in the abstract. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

Further, it will be understood that when an element is referred to as being "connected to" or "coupled to" another element, it may be directly connected to or coupled to the other element, or intervening elements may be present.

In the present disclosure, not every layer of a circuit or package is depicted in the drawings, and some blocks may be omitted from the depicted circuit or package. One of ordinary skill in the art should understand that the circuit or package can include more layers to implement functionality of the circuit or package and omitting these layers is merely for convenience of descriptions.

The demand for higher memory capacity is incessant. Moreover, the higher the memory capacity, the higher the bandwidth of the memory circuit is demanded.

A memory circuit may include a memory array of memory cells, each memory cell being capable of storing a certain amount of information, such as one or more bits. Usually, the memory array does not exist by itself but comes with other circuits that cooperate with the memory array, such as an address decoder for addressing one or more particular memory cells in the array and a sensing element for reading/writing information of the addressed memory cells.

Circuit manufacturing technology, such as the technology for making semiconductor-based integrated circuits (IC), rapidly improves by a continuous decrease in the size of the smallest circuit element that can be made with a certain generation of the technology. For example, while a so-called 90-nanometer (nm) manufacturing process (sometimes referred to as the 90-nm technology node) was considered cutting-edge only several years ago, it is now possible to contemplate a 5-nm manufacturing process with mass production capability.

Numerous semiconductor circuits of the same type can be made on one semiconductor wafer, which is then cut to produce tens or even hundreds of the semiconductor circuits of the same type, allowing for low-cost mass production. Each of the portion of the cut wafer containing one of the said type of circuit may be referred to as a "die," as known by persons having ordinary skill in the art.

Improvement in IC manufacturing technology allows for more circuit elements or devices to be made on one die of the same size. Hence, an improved IC manufacturing technology can result in a higher memory capacity in the same size of a die with memory circuits. An improved IC manufacturing technology can result in a higher computational power in the same size of a die with logic and/or computational circuits. Another was to phrase these improvements is the ability to provide more function/capacity into a smaller form factor, as known by persons having ordinary skill in the art.

As mentioned before, a functional memory circuit may include a memory array of memory cells for storage and other circuits for other functions such as data retrieval, data writing, address decoding, logic and state control, data buffer, input/output (I/O) system and management, various kinds of drivers, I/O gating, and I/O interface with other hardware external to the memory circuit.

Advancement in manufacturing technology that shrinks the size of individual memory cells is one of the main contributors to the growth in memory capacity. New applications, such as artificially intelligence (AI) applications, can often successfully utilize the higher memory capacity, and in turn generates more demand for it.

Although the memory capacity can grow quickly, other performance metrics, such as bandwidth (the speed at which data can be read from/written into the memory circuit) and power consumption, do not necessarily improve at a proportional rate. One of the reasons may come from the limitation of the operation of memory cells that require a high voltage. Another reason may come from the performance requirement of the cell sensing circuits that may prevent full exploitation of the benefits of the latest manufacturing process. Also, the internal I/O system of some memory circuits has not migrated to the latest technology, thereby contributing to a less-than-optimal performance and higher power consumption. Hence, the benefits of the latest manufacturing process are sometime not fully exploited in memory circuits.

Furthermore, the inventors recognized that some of the conventional ways of designing and making memory systems do not tend to allow easy customization of memory capacity and I/O width.

Hence, there is a need for ways to better utilize the benefits of cutting-edge manufacturing technology regarding the designing and making of memory devices, circuits and systems.

One of the advantages of the embodiments of the subject matter in the present disclosure is the ability to provide memory devices, circuits and systems with customizable memory capacity.

One of the advantages of the embodiments of the subject matter in the present disclosure is the ability to provide memory devices, circuits and systems with customizable I/O width, and therefore better integration with other circuit blocks to form a larger, better-performing digital system.

One of the advantages of the embodiments of the subject matter in the present disclosure is the ability to better exploit the benefits of improvements in manufacturing technology in the design and making of memory devices, circuits and systems. The benefits may include at least one of a higher memory capacity, a less power consumption, and a shorter access time, a higher memory bandwidth. Combinations of several or all aforementioned benefits can also be realized.

To achieve at least one of the abovementioned technical advantages, the memory array of memory cells and the other circuits that do not provide the bulk of the storage capacity may be made on different dies and then combined together; the combination may be implemented in a plurality of ways. Some of such ways may relate to utilizing packaging techniques, such as 2.5D IC (e.g., the use of an interposer) and 3D IC (e.g., the use of die-to-die vias between two dies that are vertically displaced from each other).

Manufacturing processes may thus be tailored to requirements that may be specific to the memory array and/or the other circuits (often logic circuits) that do not provide the bulk of the storage capacity. In other words, the manufacturing of the memory array does not have to be bound by considerations specific to the manufacturing of the other circuits that do not provide the bulk of the storage capacity, and vice versa.

Independent designs of memory arrays and such other circuits (sometimes referred to as the "peripheral circuits") thus become possible.

A higher degree of customization in the communication interface between the two dies also becomes possible. In addition, a higher degree of customization in the communication interface with other hardware external to the memory circuit becomes possible.

Furthermore, a reduction in power consumption by optimizing manufacturing processes for various individual circuit blocks becomes possible.

Furthermore, implementing the bulk of the memory capacity and the associated logic circuits on separate dies can allow for flexible I/O density and/or pin density to each of the dies.

Additional details of possible embodiments of the subject matter of the present disclosure are described below with the accompanying drawings.

FIG. 1 illustrates a circuit 1 in accordance with some embodiments of the present disclosure. The circuit 1 is a memory circuit. The circuit 1 may be made by IC manufacturing technologies. The circuit 1 and/or some components thereof may be based on semi-conductive materials.

The circuit 1 includes a die 10 and a die 11. The die 10 may be referred to as a first die, and the die 11 may be referred to as a second die. The dies 10 and 11 may be coupled to each other by an interface 13. The dies 10 and 11 may be based on semiconductors, and may be individually fabricated.

The die 10 may include one or more memory arrays 100. In the example of FIG. 1, the die 10 includes an array of memory arrays 100, although this is not a limitation to the subject matter of the present disclosure. The size of the array is flexible, and may be determined based on the need for memory capacity. The memory array 100 includes memory cells and other circuits and will be described in more detail afterwards.

In the exemplary array of FIG. 1, the number of rows may range from K to L, and the number of columns may range from P to Q, where K, L, P and Q are appropriate integers. In an embodiment, the designer of the circuit 1 and the die 10 does not have to start from scratch. Instead, the designer of the die 10 may choose from a library of well-defined circuits that may go into the die 10. The library may be supplied by third-party intellectual property (IP) providers. The library may be supplied by specialists in IC manufacturing. Thus, the designer of the circuit 1 and the die 10 can flexibly choose the amount of memory capacity that the circuit 1 may need. This flexibility contributes to the lowering of design cost. Using well-defined circuits from the library supplied by IC manufacturing specialists may also contribute a reduction in the manufacturing cost because aspects of the circuits related to manufacturing have already been worked out and thought through by the IC manufacturing specialists.

The die 11 may include various circuits, such as digital circuits and logic circuits, that can cooperate with the die 10 in order to make the circuit 1 a functional memory circuit, device and/or system. In an embodiment, most of the memory capacity of the circuit 1, such as more than 90%, more than 95%, more than 97%, more than 99%, more than 99.9% and more than 99.99% of the memory capacity of the circuit 1, is provided by the die 10. However, this does not preclude the die 11 from having some memory capacity for the proper functioning of the circuits in the die 11.

In some embodiments, the die 11 may include blocks, circuits or modules such as logic controllers, state controllers, row latches, row decoders, column latches, column decoders, wordline driver pre-decoders, address decoders, write drivers, and circuits related to I/O between the dies 10 and 11 and to I/O between the circuit 1 and other circuits external to the circuit 1. Hence, the die 11 may communicate with the die 10 to access the data stored in the memory arrays 100. Access may include reading and writing. Hence, the die 11 may read data stored in some memory arrays 100 of the die 10 and output the data to circuits external to the circuit 1. Hence, the die 11 may, upon request from circuits external to the circuit 1, write data into some memory arrays 100 of the die 10.

The interface 13 may include direct electrical connection, and may be implemented with any appropriate ways, such as wires, pins and pads. Signals may be communicated via the interface 13. Exemplary signals that may be transferred over the interface 13 include, but are not limited to, signals with routing information, signals related to I/O internal and/or external to the circuit 1, signals related to column address control, signals related to row address control, signals related to data access, and signals related to timing and clock.

It was mentioned that the dies 10 and 11 may be individually fabricated. Hence, in some embodiments, the dies 10 and 11 may be made from different manufacturing processes.

Different manufacturing processes may be characterized in several ways. In some embodiments, a manufacturing process is characterized by the maximum degree of miniaturization of certain types of circuit elements that can be made by such process. For example, a manufacturing process may be characterized by the minimum channel length of the metal-oxide-semiconductor field-effect transistor (MOSFET) that can be fabricated by such process. The minimum channel length may be referred to as the "smallest feature size" in appropriate contexts known by persons having ordinary skill in the art. In some embodiments, the oxide thickness of the MOSFET may also contribute to the characterization of a manufacturing process. In some embodiments, a manufacturing process may be characterized by the so-called process node or technology node, which also describes the degree of miniaturization. For example, while the 10-micron process may have been considered advanced in the years of nineteen seventies, the 10-nanometer (10-nm) process is common today, representing a 1000-fold increase in the degree of miniaturization.

In some embodiments, the die 11 is made with a manufacturing process that has a smallest feature size that is smaller than the manufacturing process associated with the fabrication of the die 10. The other way round is also possible in some other embodiments. The smallest feature size may also be referred to as the critical dimension or the characteristic critical dimension because this dimension is a principal characteristic of a particular manufacturing process.

The dies 10 and 11 may be distinguished from each other by ways, such as the maximum voltage or current at which some or all of the circuit blocks of the dies 10 and 11 can operate. For example, operating the circuits and/or dies at a higher maximum voltage may be suitable if a higher voltage swing is needed; on the other hand, operating the circuits and/or dies at a lower maximum voltage may be suitable for reducing power consumption and leakage.

For example, the die 10 may require a larger voltage swing than the die 11 for having an amplifier (such as sensing amplifier for reading the memory cells); too low an available voltage swing may reduce the performance of the sensing amplifier. In contrast, the die 11 may require a smaller voltage swing because most of the circuits in the die 11 are logical circuits that do not necessarily require a large dynamic range.

Note that the available voltage swing on a die may be affected by various factors, one of them being the manufacturing process used to make such die.

Hence, it can lead to further flexibility and optimization to use different manufacturing processes for making the die 10, which provide the bulk of the memory capacity, and the die 11, which does not provide the bulk of the memory capacity and mainly includes logic functionality of the memory circuit 1.

For example, the die 10 may be made by a process with a lower smallest feature size (e.g., 5 nm) compared to the die 11 (e.g., 10 nm), if a high memory density is required for the die 10. In other situations, the die 11 may be made by a process with a lower smallest feature size compared to the die 10 if reducing the area of the die 11 is more important.

For example, the memory die 10 may allow a higher voltage swing to improve the performance of the sensing operation, whereas the peripheral circuit die 11 may allow a lower voltage swing to improve power consumption.

In some embodiments, the first die 10 may be referred to as the "memory" die. In some embodiments, the second die 11 may be referred to as the "peripheral circuit" die.

Figure 2:
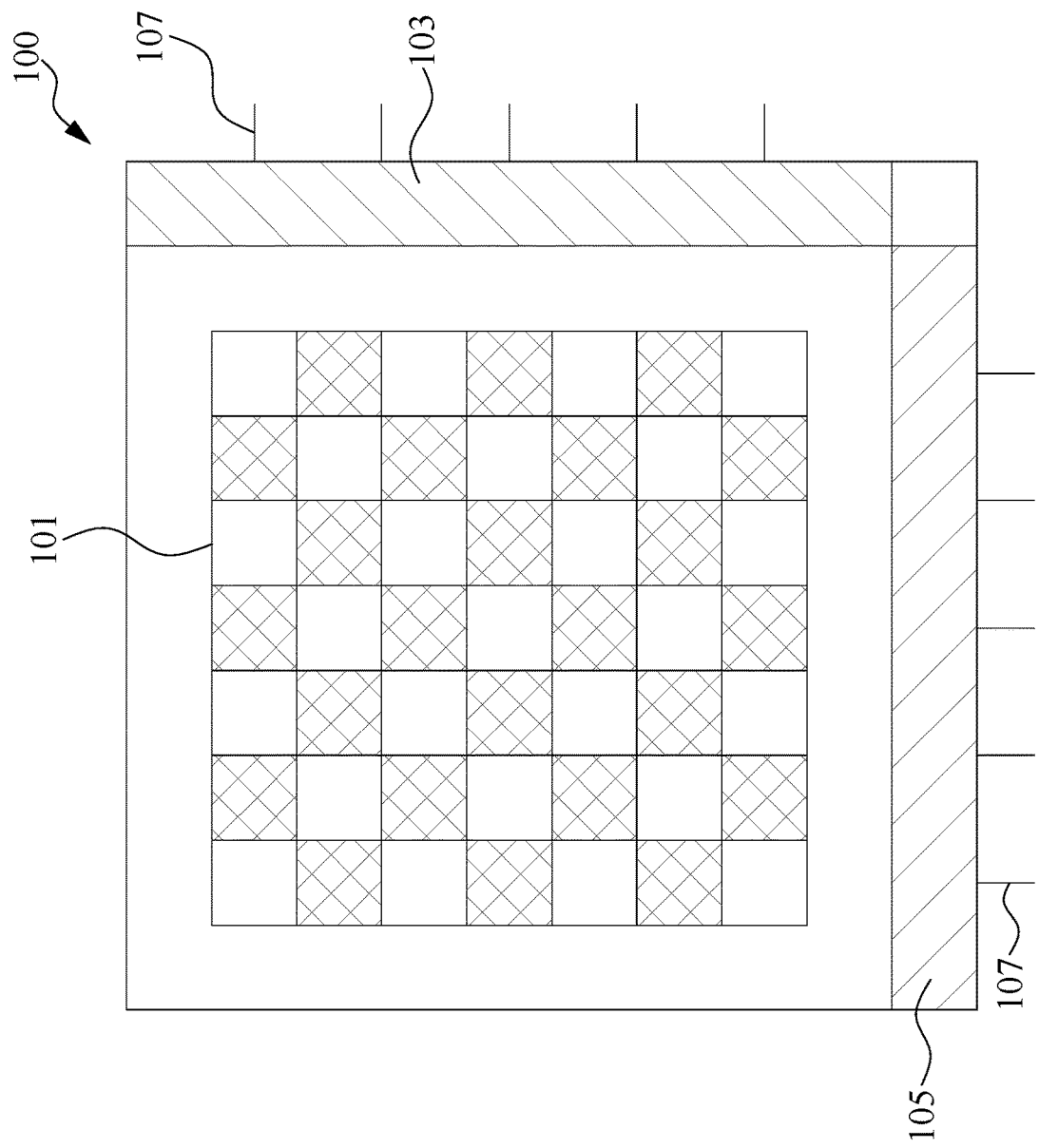
FIG. 2 illustrates a memory array in accordance with some embodiments of the present disclosure.

FIG. 2 illustrates a memory array 100 in accordance with some embodiments of the present disclosure.

The memory array 100 includes memory cells 101, a sensing element 103, a wordline driver 105 or a portion thereof, and at least one electrical connection 107.

The memory cells 101 are capable of storing information and may be implemented with various kinds of appropriate data storage devices or state storage devices. A data storage device that stores one bit, which is the smallest unit of information, can sometimes be referred to as a bit storage device. The operation of data storage device may be based on the storage of electric charges, electric voltages, electric resistances, magnetic states, ferromagnetic states, optical states and/or other appropriate mechanisms.

As the plurality of memory arrays 100 in the die 10 may be organized by rows and columns, the memory cells 101 may also be organized by rows and columns. The combination of a specific row and a specific column may allow the addressing of one or more specific data storage devices and thus may be referred to as an address. The addressing may be performed by an address decoder, which, in some embodiments, may reside on the second die 11. In some embodiments, the rows of the memory cells 101 may be accessed by word lines. In some embodiments, the columns of the memory cells 101 may be accessed by bit lines.

The sensing element 103 is used to sense the state of the memory cells 101, thereby allowing the reading of data stored in the memory cells 101. In some embodiments, the sensing element 103 includes a sense amplifier to amplify the electric voltage stored in the particular memory cell that is being read. The sense amplifier may be implemented with electronic circuitry.

The wordline driver 105 may help access rows of the memory cells 101. The wordline driver 105 may help write data into the memory cells 101. In some embodiments, only a portion of the wordline driver 105 is included in the memory array 100; in such a case, the other portions of the wordline driver may reside in the second die 11. In an embodiment, only the wordline driver buffer is included in block 105 within the memory array 100.

The electrical connections 107 may take many forms, such as wires, pins and pads. The electrical connections 107 connect part or all of the circuitry in the memory array 100 to circuitry outside the memory array 100.

Figure 3:
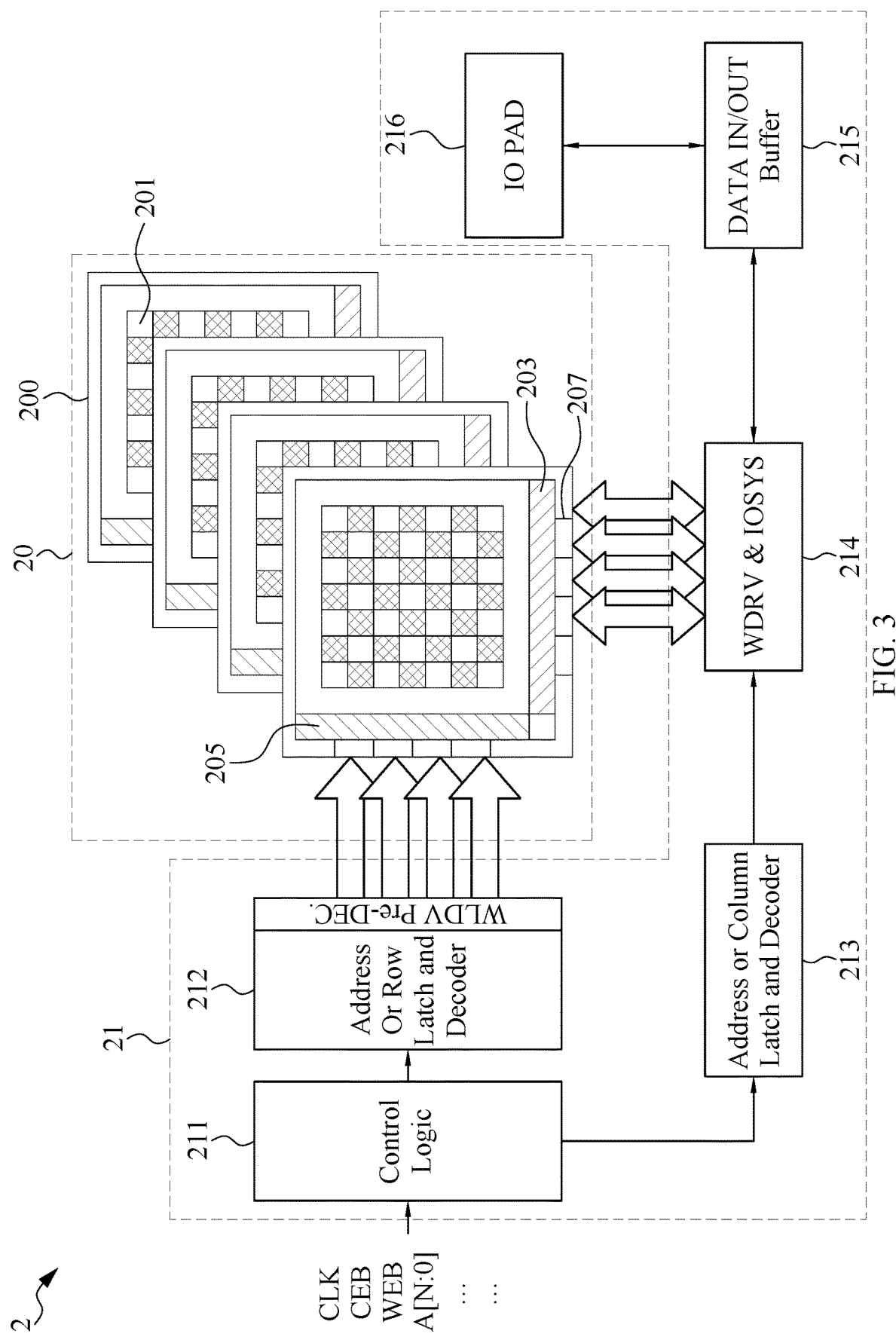
FIG. 3 illustrates a circuit in accordance with some embodiments of the present disclosure.

FIG. 3 illustrates a circuit 2 in accordance with some embodiments of the present disclosure.

The circuit 2 includes a die 20 and a die 21, which may be respectively referred to as the first die 20 and the second die 21. Each of the dies 20 and 21 may include several circuit blocks or modules.

The die 20 illustrated in the embodiment of FIG. 3 includes a plurality of memory arrays 200. Each of the memory arrays 200 may include memory cells 201, a sensing element 203, a wordline driver buffer 205, and electrical connections 207. The memory array 200 in FIG. 3 may be similar to the memory array 100 in FIG. 2, so a detailed description of the memory array 200 can be omitted here.

The die 21 illustrated in the embodiment of FIG. 3 includes several blocks 211, 212, 213, 214, 215 and 216, each of which may serve a particular function. Note the functions illustrated in the blocks of FIG. 3 are merely exemplary and are not intended as limitation.

The block 211 may include control logic suitable for controlling the operation of the die 21 in terms of at least its interaction with the die 20 and external circuits and systems. The block 211 may receive various signals, such as clock signals, address signals and data signals, and may instruct other blocks in the die 21 to interact with the die 20.

Blocks 212 and 213 constitute an address decoder suitable for addressing particular memory cells 201 in the memory array 200 of the memory die 20. In some embodiments, block 212 may include a wordline driver pre-decoder.

Block 214 may include write drivers and circuits/modules related to I/O interfaces with the die 20. In an embodiment, the die 21 is connected to the sensing element 203 of the die 20. In an embodiment, the die 21 is directed connected to the sensing element 203 of the die 20 through an I/O block of the die 21.

Block 214 may be used during a write operation (through, e.g., I/O circuitry therein) to write data into the memory cells 201. Block 214 may be used during a read operation to read out data output by the sensing element 203 of the die 20.

Data that the block 214 receives from the sensing element 203 during a read operation may be first stored in a data buffer before being transferred to circuits external to the circuit 2. Data that are received from circuits external to the circuit 2 for being written into the memory array 200 of the die 20 may arrive a data buffer first before reaching block 214 and eventually being written into the memory array 200. Hence, block 215 may be an data in/out buffer.

Block 216 may represent the actual physical features that implement the I/O functions regarding circuits external to the circuit 2, such as pads, pins, conductive posts and pillars, etc. Data being read from or to be written to the memory arrays 200 may go through block 216.

Figure 4:
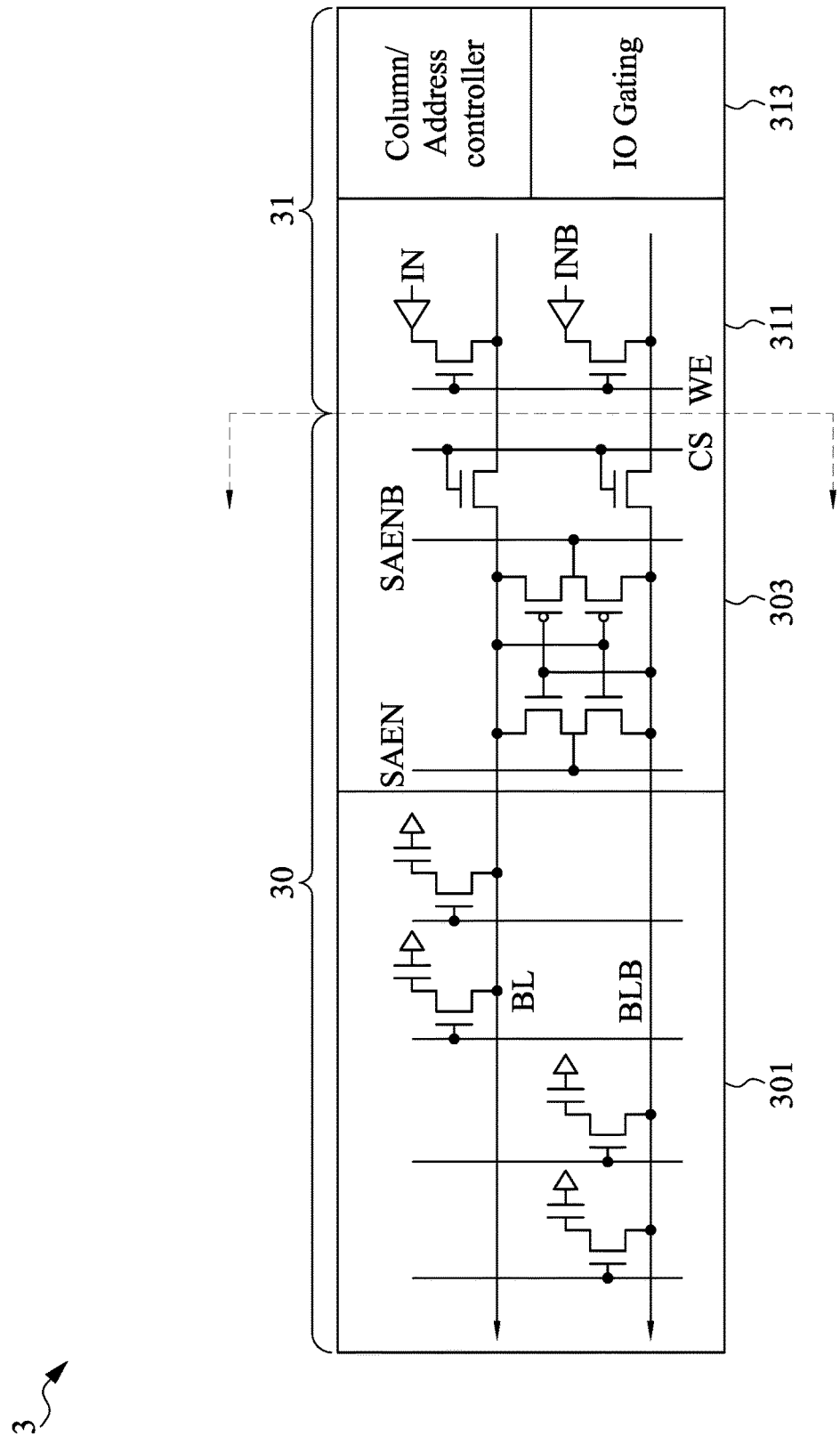
FIG. 4 illustrates a circuit in accordance with some embodiments of the present disclosure.

FIG. 4 illustrates a memory circuit 3 in accordance with some embodiments of the present disclosure.

The memory circuit 3 illustrated in FIG. 4 includes a first die 30 and a second die 31. The die 30 includes blocks 301 and 303, and the die 31 includes blocks 311 and 313. It is understood that the dies 30 and 31 may include other circuits blocks and modules.

Block 301 schematically illustrates some of the memory cells that provide most of the memory capacity of the circuit 3. An individual memory cell in the embodiment of FIG. 4 includes a switch (which may be implemented with a transistor) and a bit storage device (which may be implemented with a capacitor). The memory cells may be accessed by bit lines BL and complementary bit lines BLB.

Block 303 schematically illustrates circuitry for accessing the memory cells in block 301. Included in block 303 of the embodiment of FIG. 4 are a sense amplifier that can be controlled by a signal SAEN and its complement SAENB for controlling whether the sense amplifier is enabled or not. Block 303 may also include circuitry controlled by the signal CS (cell selection) for controlling the selection of particular cells to be accessed.

Block 311 schematically illustrates a portion of the write driver, which can be controlled by the signal WE (write enable) and a pair complementary input signals IN and INB.

Block 313 schematically illustrates other circuit blocks that do not provide the hulk of memory capacity of the circuit 3 but may be useful for accessing and/or interacting with the die 30 and circuits external to the circuit 3.

Figure 5:
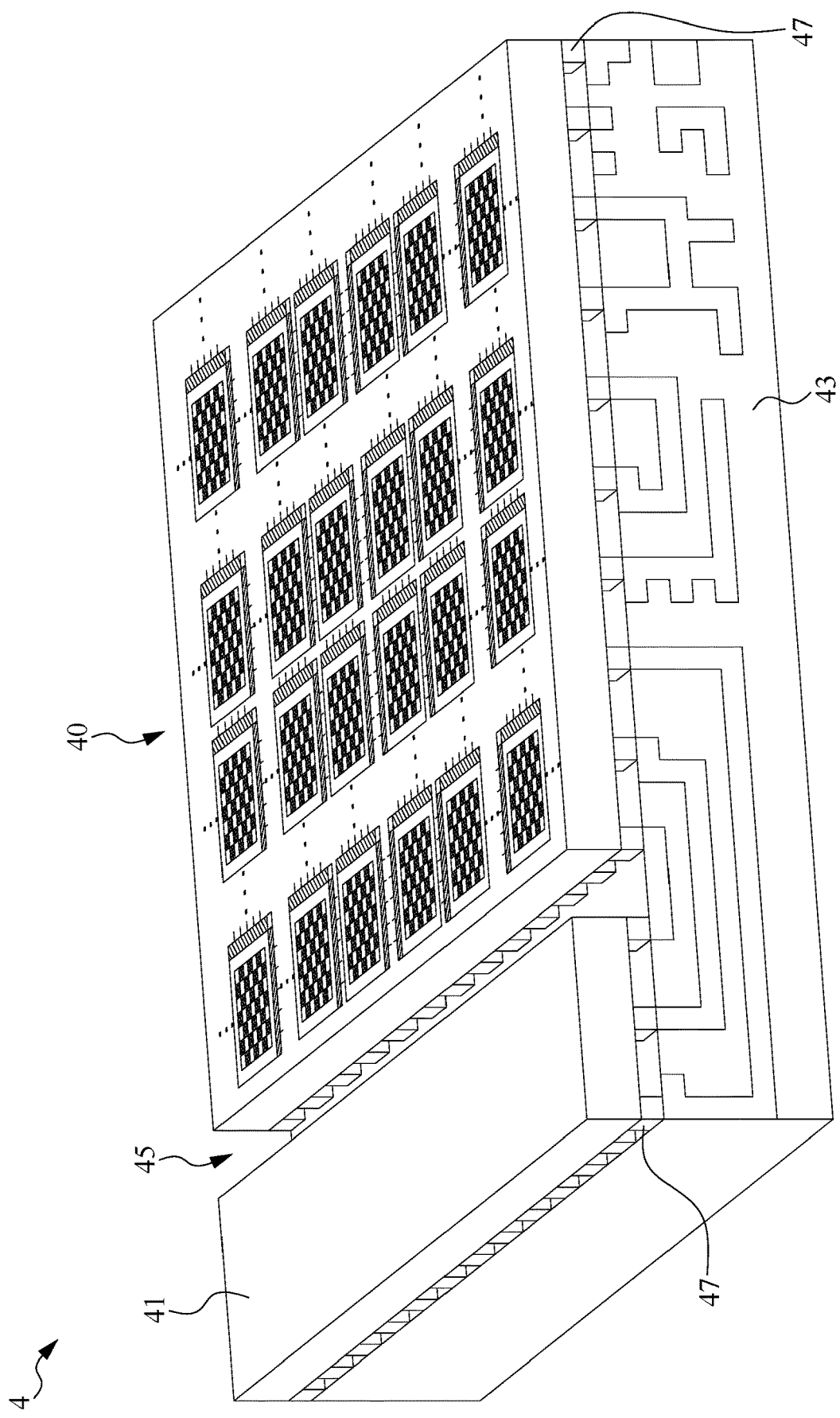
FIG. 5 illustrates a circuit in accordance with some embodiments of the present disclosure.

FIG. 5 illustrates a memory circuit 4 in accordance with some embodiments of the present disclosure.

The circuit 4 shown in FIG. 5 includes a first die 40 comprising arrays of memory cells, a second die 41 comprising other circuits suitable for interacting with the die 40 and external circuits, and an interposer 43 that couples the die 40 to the die 41. Each of the dies 40 and 41 may include electrical connections 47 such as pins, conductive posts and conductive pillars. The dies 40 and 41 may be separated from each other by a gap 45.

The dies 40 and 41 and the interposer 43 may, together with other appropriate elements not shown in FIG. 5, form an electronic package. For example, an encapsulant may be used to further hold the die 40, the die 41 and the interposer 43 together. The encapsulant may include a molding compound (such as epoxy) and/or a wafer-level underfill (i.e., electrically insulating adhesive material applied to the die 40 and/or the die 41, for example during wafer-level processes).

The encapsulant may partially or fully fill the gap 45. The encapsulant may encapsulate some of the electrical connections 47 of the dies 40 and 41. In some embodiments, the encapsulant may fully encapsulate all of the electrical connections 47 of the die 40, fully encapsulate all of the electrical connections 47 of the die 41 or both.

In some embodiments, the encapsulant may partially encapsulate the die 40, the die 41 and/or the interposer 43. In some embodiments, the encapsulant may encapsulate the entirety of the die 40, the die 41, and/or the interposer 43.

The memory circuit 4 shown in FIG. 5 may made by 2.5D IC packaging technology.

The dies 40 and 41 may be distinguished from each other by the types of the electrical connections 47 thereof. For example, an electrical connection 47 with a lower current rating may have a smaller volume and thus suitable for contributing the smaller form factor. On the other hand, an electrical connection 47 with a higher current rating if the die it is connected to requires a higher current.

Although only one die 40 and one die 41 are illustrated in FIG. 5, the number of dies are not limited. For example, it is possible for the memory circuit to have one die 41 that works with more than one memory dies 40; in which case, each of the memory dies 40 may be made by different manufacturing processes and/or have different electrical characteristics and/or pin and I/O densities.

Figure 6:
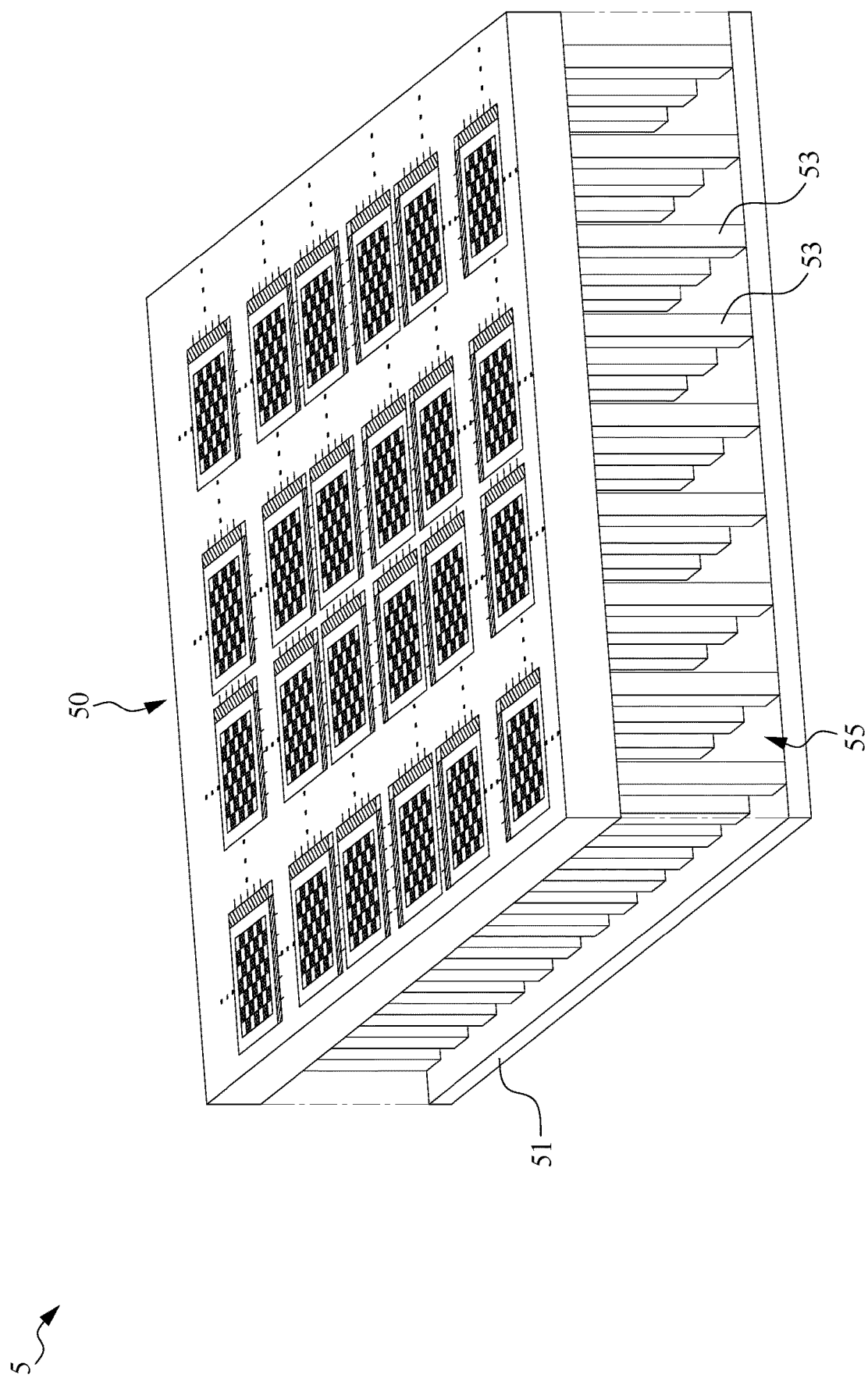
FIG. 6 illustrates a circuit in accordance with some embodiments of the present disclosure.

FIG. 6 illustrates a memory circuit 5 in accordance with some embodiments of the present disclosure.

The circuit 5 shown in FIG. 6 includes a first die 50 comprising arrays of memory cells, and a second die 51 comprising other circuits suitable for interacting with the die 50 and external circuits. The dies 50 and 51 may connected to each other by way of electrical connections 53, such as vias, die-to-die vias, through-silicon vias (TSV) and conductive pillars. Gap 55 may exist between the electrical connections 53; gap may be partially or fully filled with encapsulant.

The dies 50 and 51 and the electrical connections 53 may, together with other appropriate elements not shown in FIG. 6, form an electronic package. For example, an encapsulant may be used to strengthen the die 50, the die 51 and the electrical connections 53 together. The encapsulant may include a molding compound (such as epoxy) and/or a wafer-level underfill (i.e., electrically insulating adhesive material applied to the die 50 and/or the die 51, for example during wafer-level processes).

The encapsulant may encapsulate some of the electrical connections 53 of the dies 50 and 51. In some embodiments, the encapsulant may fully encapsulate all of the electrical connections 53 of the die 50, fully encapsulate all of the electrical connections 53 of the die 51 or both.

In some embodiments, the encapsulant may partially encapsulate the die 50, the die 51 and/or the electrical connections 53. In some embodiments, the encapsulant may encapsulate the entirety of the die 50, the die 51, and/or the electrical connections 53.

The dies 50 and 51 may be formed on different levels. The die 50 may be above the die 51, and vice versa.

The memory circuit 5 shown in FIG. 6 may be made by 3D IC packaging technology.

Although only one die 50 and one die 51 are illustrated in FIG. 6, the number of dies are not limited. For example, it is possible for the memory circuit to have one die 51 that works with more than one memory dies 50; in which case, each of the memory dies 50 may be made by different manufacturing processes and/or have different electrical characteristics and/or pin and I/O densities.

Figure 7:
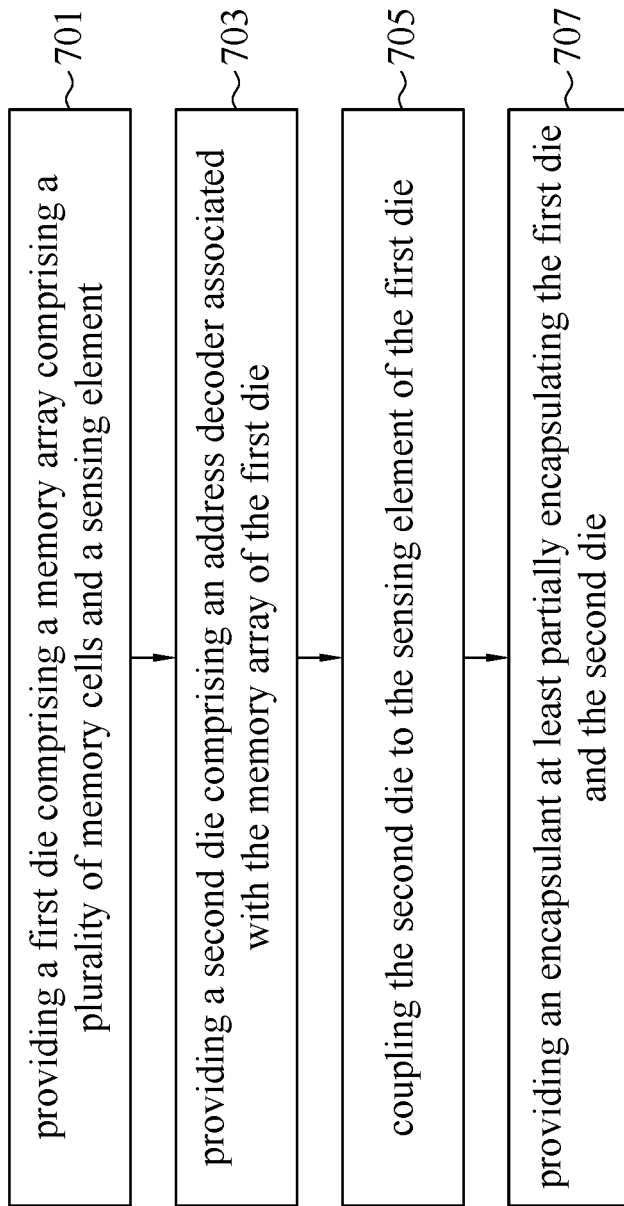
FIG. 7 illustrates an exemplary flowchart in accordance with some embodiments of the present disclosure.

FIG. 7 illustrates an exemplary flowchart in accordance with some embodiments of the present disclosure.

At step 701, a first die is provided. The first die may include a memory array comprising a plurality of memory cells and a sensing element. At step 703, a second die is provided. The second die may include an address decoder associated with the memory array of the first die.

At step 705, the second die is coupled to the sensing element of the first die. At step 707, an encapsulant that at least partially encapsulates the first die and the second die is provided.

Figure 8:
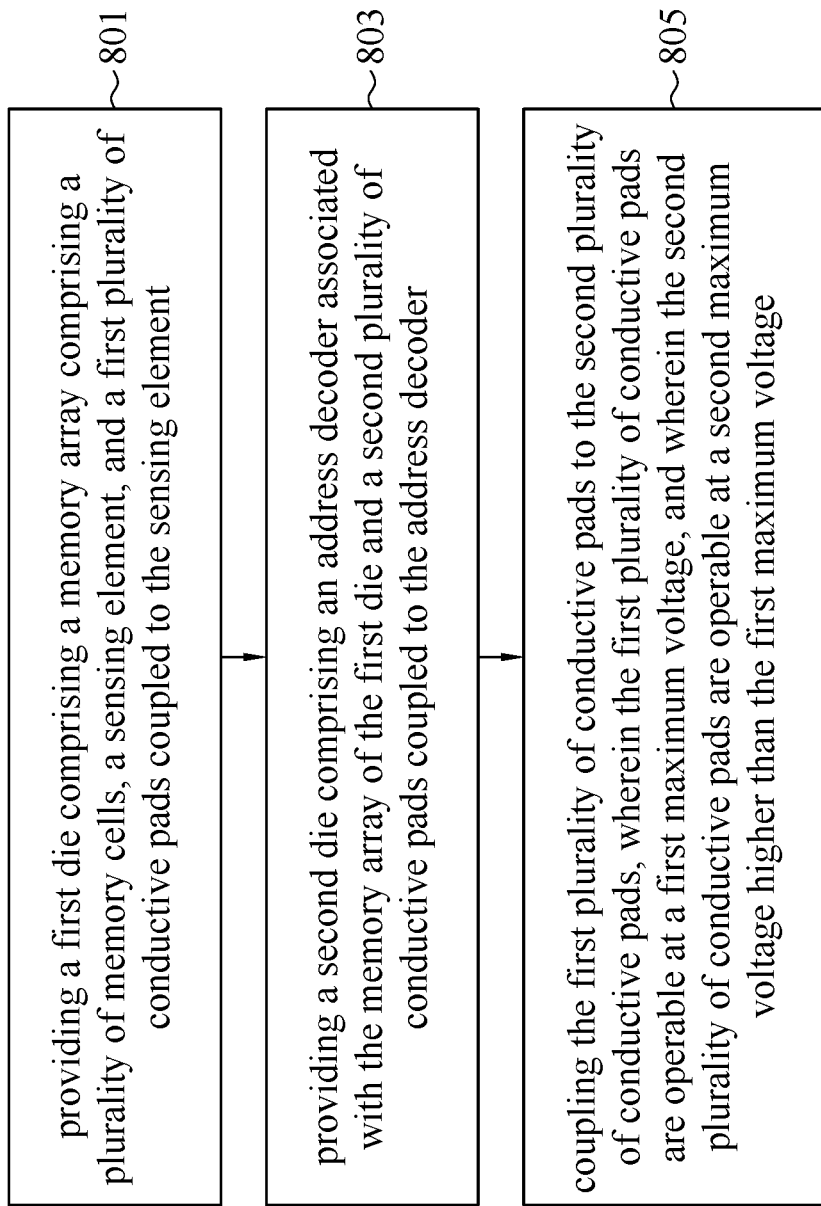
FIG. 8 illustrates an exemplary flowchart in accordance with some embodiments of the present disclosure.

FIG. 8 illustrates an exemplary flowchart in accordance with some embodiments of the present disclosure.

At step 801, a first die is provided. The first die may include a memory array comprising a plurality of memory cells, a sensing element, and a first plurality of conductive pads coupled to the sensing element. At step 803, a second die is provided. The second die may include an address decoder associated with the memory array of the first die and a second plurality of conductive pads coupled to the address decoder.

At step 805, the first plurality of conductive pads are coupled to the second plurality of conductive pads. The first plurality of conductive pads may be operable at a first maximum voltage. The second plurality of conductive pads may be operable at a second maximum voltage higher than the first maximum voltage.

Figure 9:
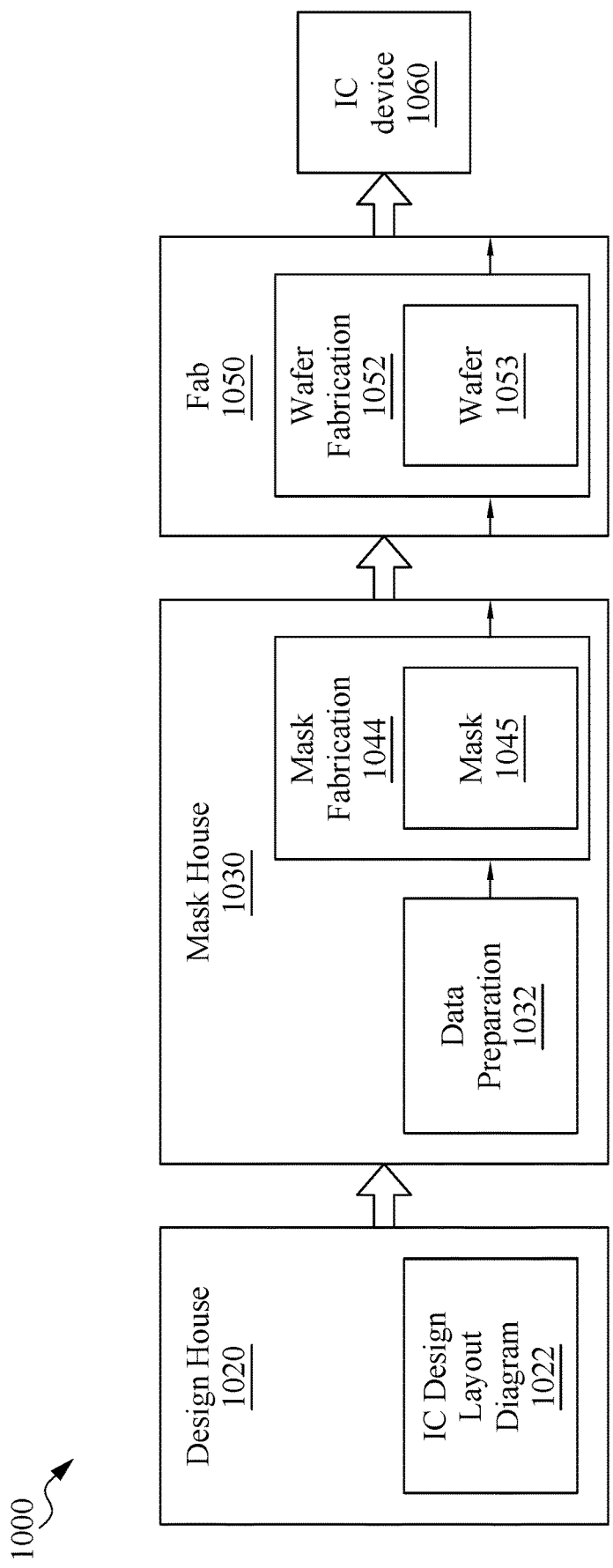
FIG. 9 is a block diagram of an integrated circuit (IC) manufacturing system 1000, and an IC manufacturing flow associated therewith, in accordance with some embodiments of the present disclosure.

FIG. 9 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 9, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 9, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

In the present disclosure, memory circuits and related methods with improvement are disclosed. The memory circuit may include multiple dies. The bulk of the memory capacity may be provided in one or more of the multiple dies. The related logic and/or I/O functions may be provided in others of the multiple dies. The multiple dies may be packaged together. These configurations can allow for optimization in manufacturing processes, electrical characteristics, and I/O and pin densities among different dies with different functions.

It will be understood that not all advantages have been necessarily discussed herein, no particular advantage is required for all embodiments or examples, and other embodiments or examples may offer different advantages.

According to an aspect of the present disclosure, a circuit is provided. The circuit includes a first die that includes a memory array, and the memory array includes a plurality of memory cells, a sensing element coupled to the plurality of memory cells, and a first plurality of conductive pads coupled to the sensing element. The circuit also includes a second die that includes an address decoder associated with the memory array of the first die and a second plurality of conductive pads coupled to the address decoder. The first die is coupled to the second die by an interposer. The address decoder of the second die is coupled to the sensing element of the first die. A first voltage swing of the first die is larger than a second voltage swing of the second die.

In an embodiment, the first die may include a first plurality of conductive posts coupled to the sensing element of the first die. The second die may include a second plurality of conductive posts. The second die may be coupled to the sensing element of the first die by coupling the first plurality of conductive posts to the second plurality of conductive posts.

In an embodiment, the interposer couples the first plurality of conductive posts to the second plurality of conductive posts.

According to an aspect of the present disclosure, a circuit is provided. The circuit may include a first die that includes a memory array, and the memory array may include a plurality of memory cells, a sensing element coupled to the plurality of memory cells, and a first plurality of conductive pads coupled to the sensing element. The circuit may include a second die that includes an address decoder associated with the memory array of the first die and a second plurality of conductive pads coupled to the address decoder. The first die may be coupled to the second die by die-to-die vias. The address decoder of the second die may be coupled to the sensing element of the first die. A first voltage swing of the first die is larger than a second voltage swing of the second die.

According to an aspect of the present disclosure, a circuit is provided. The circuit may include a first die that includes a plurality of memory arrays each including a plurality of memory cells and a sensing element coupled to the plurality of memory cells. A first smallest feature size may be associated with the first die. The circuit may include a second die including an address decoder associated with the memory array of the first die. A second smallest feature size that is smaller than the first smallest feature size may be associated with the second die. The address decoder of the second die may be coupled to the sensing elements of the first die. The plurality of memory arrays may be organized by rows and columns.

In an embodiment, the sensing element may be configured to output data stored in the plurality of memory cells of the first die to the second die during a read operation of the memory circuit. In an embodiment, the second die may comprise a system I/O circuit configured to, during the read operation, receive the data output from the sensing element of the first die.

In an embodiment, the second die may include at least one from the group consisting of: a logic controller, a row latch, a row decoder, a column latch, a column decoder, and a wordline driver pre-decoder.

In an embodiment, the first die may be coupled to the second die by an interposer. In an embodiment, the encapsulant may at least partially encapsulate the interposer.

In an embodiment, the first die may be coupled to the second die by die-to-die vias. In an embodiment, the encapsulant may at least partially encapsulate at least some of the die-to-die vias. In an embodiment, the encapsulant may fully encapsulate all of the die-to-die vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A circuit, comprising:
    a first die comprising a memory array, the memory array comprising a plurality of memory cells, a sensing element coupled to the plurality of memory cells, and a first plurality of conductive pads coupled to the sensing element; and
    a second die comprising an address decoder associated with the memory array of the first die and a second plurality of conductive pads coupled to the address decoder;
    wherein the first die is coupled to the second die by an interposer,
    wherein the address decoder of the second die is coupled to the sensing element of the first die, and
    wherein a first voltage swing of the first die is different from a second voltage swing of the second die.

2. The circuit of claim 1, further comprising:
    an encapsulant at least partially encapsulating the first die and the second die.

3. The circuit of claim 2, wherein the encapsulant is a molding compound or a wafer-level underfill material.

4. The circuit of claim 1, wherein the first die comprises a first plurality of conductive posts coupled to the sensing element of the first die, wherein the second die comprises a second plurality of conductive posts coupled to the first plurality of conductive posts.

5. The circuit of claim 4, wherein the encapsulant at least partially encapsulates the first plurality of conductive posts and the second plurality of conductive posts.

6. The circuit of claim 5, wherein the encapsulant fully encapsulates the first plurality of conductive posts, the second plurality of conductive posts, or both.

7. The circuit of claim 1, wherein the first die is made from a first manufacturing process, wherein the second die is made from a second manufacturing process, wherein the second manufacturing process differs from the first manufacturing process in at least one of a smallest feature size and a technology node.

8. The circuit of claim 7, wherein a first smallest feature size associated with the first manufacturing process is smaller than a second smallest feature size associated with the second manufacturing process.

9. A circuit, comprising:
    a first die comprising a memory array, the memory array comprising a plurality of memory cells, a sensing element coupled to the plurality of memory cells, and a first plurality of conductive pads coupled to the sensing element; and
    a second die comprising an address decoder associated with the memory array of the first die and a second plurality of conductive pads coupled to the address decoder;
    wherein the first die is coupled to the second die by die-to-die vias,
    wherein the address decoder of the second die is coupled to the sensing element of the first die, and
    wherein a first voltage swing of the first die is different from a second voltage swing of the second die.

10. The circuit of claim 9, wherein the sensing element is configured to output data stored in the plurality of memory cells of the first die to the second die during a read operation.

11. The circuit of claim 10, wherein the second die comprises a system I/O circuit coupled to the second plurality of conductive pads and configured to, during the read operation, receive the data output from the sensing element of the first die.

12. The circuit of claim 11, wherein the system I/O circuit is configured to, during the read operation, output the data received by the system PO circuit from the first die to outside the second die by way of at least some of the second plurality of conductive pads.

13. The circuit of claim 9, wherein a first electric current rating is associated with the first plurality of conductive pads and a second electric current rating higher than the first electric current rating is associated with the second plurality of conductive pads.

14. The circuit of claim 9, further comprising an encapsulant that at least partially encapsulates at least some of the die-to-die vias.

15. A circuit, comprising:
    a first die comprising a plurality of memory arrays each comprising a plurality of memory cells and a sensing element coupled to the plurality of memory cells, wherein a first smallest feature size is associated with the first die; and
    a second die comprising an address decoder associated with the memory array of the first die, wherein a second smallest feature size that is smaller than the first smallest feature size is associated with the second die;
    wherein the address decoder of the second die is coupled to the sensing elements of the first die, and
    wherein the plurality of memory arrays are organized by rows and columns.

16. The circuit of claim 15, wherein the address decoder of the second die is configured to access a particular memory cell of the plurality of memory arrays of the first die by an address of the particular memory cell.

17. The circuit of claim 15, wherein the first die is coupled to the second die by an interposer.

18. The circuit of claim 15, wherein the first die comprises a wordline driver coupled to the plurality of memory arrays.

19. The circuit of claim 15, wherein the first die is coupled to the second die by die-to-die vias.

20. The circuit of claim 15, wherein the second die comprises a write driver configured to, during a write operation, write data to the memory cells of the plurality of memory arrays of the first die.

* * * * *